United States Patent
Sun et al.

(10) Patent No.: US 8,324,013 B2
(45) Date of Patent: Dec. 4, 2012

(54) METHOD OF FABRICATING ORGANIC LIGHT EMITTING DIODE DISPLAY DEVICE

(75) Inventors: Jin-Won Sun, Yongin (KR); Tae-Min Kang, Yongin (KR); Sang-Bong Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 38 days.

(21) Appl. No.: 12/956,413

(22) Filed: Nov. 30, 2010

(65) Prior Publication Data

US 2011/0136278 A1   Jun. 9, 2011

(30) Foreign Application Priority Data

Dec. 7, 2009   (KR) .................. 10-2009-0120649

(51) Int. Cl.
*H01L 21/00* (2006.01)
(52) U.S. Cl. .................. 438/82; 257/E21.567
(58) Field of Classification Search .............. 438/82; 257/E21.567
See application file for complete search history.

(56) References Cited

U.S. PATENT DOCUMENTS

| | | | |
|---|---|---|---|
| 6,555,284 B1 * | 4/2003 | Boroson et al. | 430/201 |
| 6,777,025 B2 * | 8/2004 | Bedzyk | 427/171 |
| 6,953,735 B2 * | 10/2005 | Yamazaki et al. | 438/457 |
| 7,817,175 B2 * | 10/2010 | Noh et al. | 347/171 |
| 2004/0123940 A1 | 7/2004 | Bedzyk | |

FOREIGN PATENT DOCUMENTS

| | | |
|---|---|---|
| KR | 20-0389384 | 7/2005 |
| KR | 10-0651260 | 11/2006 |
| KR | 10-2007-0014737 | 2/2007 |
| KR | 10-2007-0024820 | 3/2007 |
| KR | 10-0721288 | 5/2007 |
| KR | 10-2007-0060451 | 6/2007 |
| KR | 10-2008-0071337 | 8/2008 |
| WO | WO 2005/091683 | 9/2005 |

OTHER PUBLICATIONS

English Abstract for KR 10-2007-0044960 published May 2, 2007.
English Abstract for KR 10-2006-0031966 published Apr. 14, 2006.

* cited by examiner

*Primary Examiner* — William D Coleman
(74) *Attorney, Agent, or Firm* — Christie, Parker & Hale, LLP

(57) ABSTRACT

An organic layer of an organic light emitting diode (OLED) display device is formed by transferring a transfer layer of a donor film to aligned pixel openings in a pixel defining region of the OLED display device such that the organic layer is formed in the pixel openings. Each aligned pixel opening has a pair of long sides and a pair of short sides, and the transferring of the transfer layer is performed by applying tensile force to the donor film in a direction perpendicular to the short sides of the pixel openings.

9 Claims, 4 Drawing Sheets

METHOD OF FABRICATING ORGANIC LIGHT EMITTING DIODE DISPLAY DEVICE

CROSS-REFERENCE TO RELATED APPLICATIONS

This application claims the benefit of Korean Patent Application No. 10-2009-0120649, filed Dec. 7, 2009, in the Korean Intellectual Property Office, the disclosure of which is hereby incorporated herein by reference in its entirety.

BACKGROUND OF THE INVENTION

1. Field of the Invention

Aspects of the present invention relate to a method of fabricating an organic light emitting diode (OLED) display device, and more particularly, to a method of fabricating an OLED display device in which an organic layer is formed by transferring a transfer layer.

2. Description of the Related Art

Generally, an OLED display device is fabricated by forming an anode on an insulating substrate, forming an organic layer on the anode, and forming a cathode on the organic layer. The organic layer includes an emitting layer, and may further include at least one of a hole transport layer, a hole injection layer, an electron transport layer, a hole blocking layer, and an electron injection layer.

To form the organic layer, deposition, inkjet printing, or laser induced thermal imaging (LITI) can be used. LITI is a method of forming an R, G, or B organic layer by irradiating a donor film including a light-to-heat conversion layer and a transfer layer formed on the light-to-heat conversion layer with a laser beam such that laser energy is converted into thermal energy by the light-to-heat conversion layer and the transfer layer is transferred to an acceptor substrate by the converted thermal energy. The donor film may be irradiated with the laser beam selectively, such that the transfer layer is transferred to the acceptor substrate only at predetermined locations. During the formation of the organic layer through LITI, the donor film is adhered to the acceptor substrate, but after the transfer layer is transferred to the acceptor substrate, the donor film and the acceptor substrate are separated from each other, leaving behind the transfer layer adhered to the acceptor substrate. To facilitate the transfer process, tensile force may be applied to the donor film using clamps disposed at opposite sides thereof.

The separation of the donor film from the acceptor substrate may be performed by injecting air between the donor film and the acceptor substrate to urge the donor film apart from the acceptor substrate. If the separation of the donor film from the acceptor substrate is not carried out smoothly, lifting of the transferred transfer layer from the acceptor substrate may occur due to adhesion between the transfer layer and the donor film and due to the tensile force applied to the donor film. In particular, if the tensile force applied to the donor film is applied in a direction perpendicular to the long side of a pixel opening (for example, in the direction B shown in FIG. 1), the long side of the pixel opening is under a lot of stress due to the tensile force, and thus, there is a relatively large region of the pixel opening where it is possible to have lifting of the transfer substrate from the acceptor substrate when the donor film is separated from the acceptor substrate.

SUMMARY OF THE INVENTION

Aspects of the present invention provide a method of fabricating an OLED display device in which an organic layer is formed by effectively transferring a transfer layer.

According to an aspect of the present invention, a method of fabricating an OLED display device i includes transferring a transfer layer of a donor film to aligned pixel openings in a pixel defining region of the OLED display device, wherein each pixel opening has a pair of long sides and a pair of short sides, such that an organic layer is formed in the pixel openings. The transferring is performed while a tensile force is applied to the donor film in a direction perpendicular to the short sides of the pixel openings.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
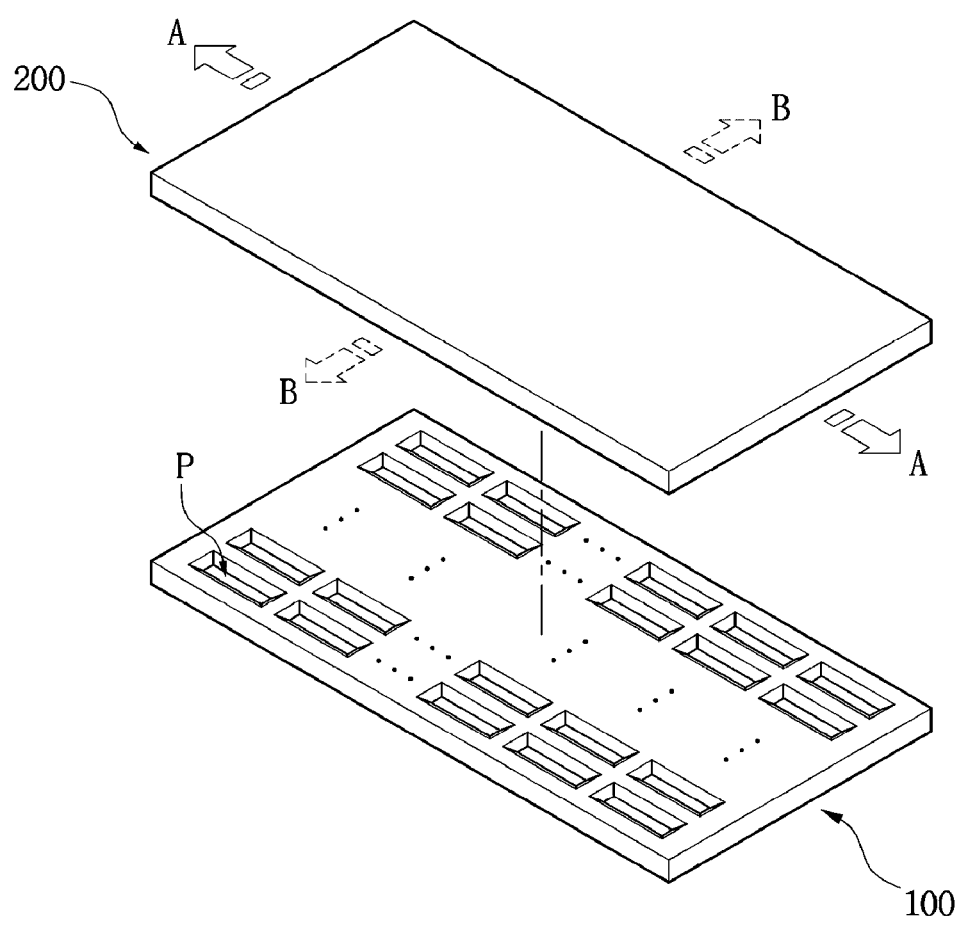
FIG. 1 is an exploded perspective view illustrating the arrangement of a donor film and an OLED display device when the donor film and the OLED display device are arranged according to an exemplary embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures Moreover, it is to be understood that where is stated herein that one layer is "formed on" or "disposed on" a second layer, the first layer may be formed or disposed directly on the second layer or there may be intervening layers between the first layer and the second layer. Further, as used herein, the term "formed on" is used with the same meaning as "located on" or "disposed on" and is not meant to be limiting regarding any particular fabrication process.

Hereinafter, a method of fabricating an OLED display device according to an exemplary embodiment of the present invention will be described with reference to the accompanying drawings. According to the exemplary embodiment, a donor film is adhered to an OLED display device after tensile force is applied to the donor film, but the present invention is not limited thereto. The tensile force may be applied to the donor film while the donor film is in contact with the OLED display device, and transferring of the transfer substrate may start when the tensile force is applied to the donor film.

Figure 2:
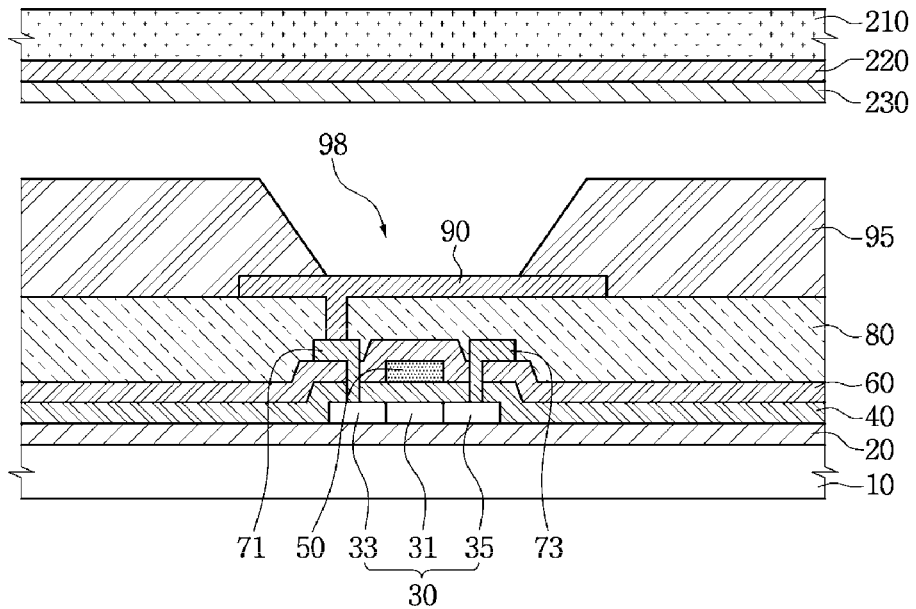
FIG. 2 is a cross-sectional view illustrating a pixel region when the donor film and the OLED display device are arranged according to an exemplary embodiment of the present invention.

FIG. 1 is an exploded perspective view illustrating arrangement of a donor film and an OLED display device when the donor film and the OLED display device are arranged according to an exemplary embodiment of the present invention. FIG. 2 is a cross-sectional view illustrating a pixel region when the donor film and the OLED display device are arranged according to the exemplary embodiment of the present invention.

Referring to FIGS. 1 and 2, an OLED display device 100 including a plurality of pixels P is fabricated on a substrate 10. A donor film 200 including a transfer layer 230 to be transferred to the pixels P is disposed on the OLED display device 100.

The pixels P may be classified as red (R), green (G), and blue (B) pixels according to the kind of an organic emitting layer constituting the transfer layer 230.

The pixels P include an opening 98 through which the transfer layer 230 is transferred. The opening 98 is formed in a rectangular shape having long and short sides.

Here, to prevent sagging of the donor film 200, tensile force is applied to the donor film in a direction of the arrow drawn in a solid line of FIG. 1, i.e., in direction A, and the tensile force works perpendicular to the short side of the opening 98 of the pixel P.

Figure 4A:
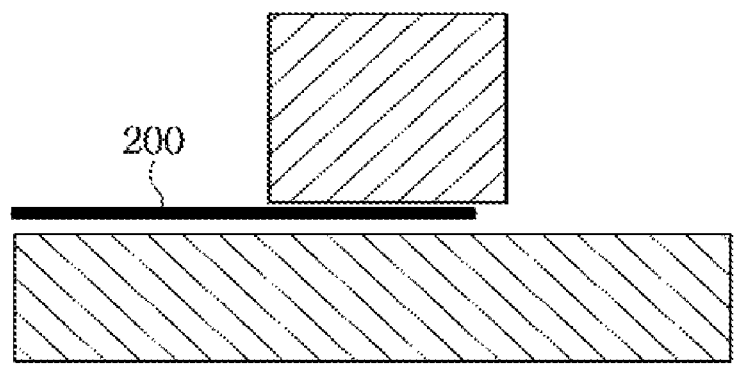
FIGS. 4A and 4B are schematic views illustrating a method of applying tensile force to a donor film.
Figure 4B:
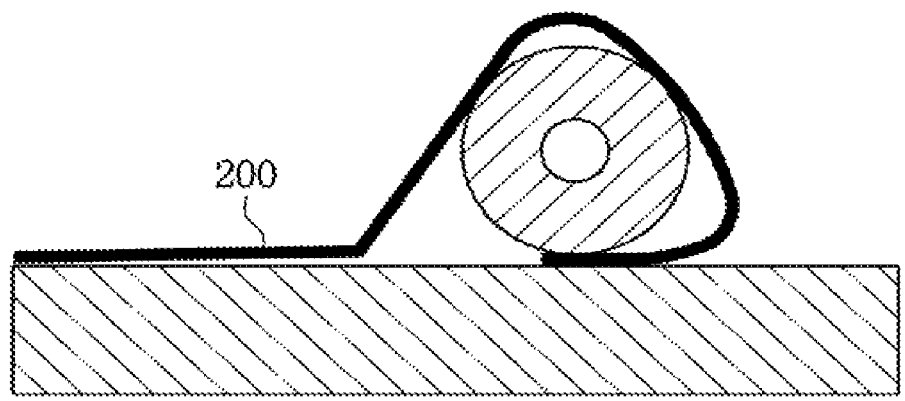

FIGS. 4A and 4B schematically illustrate methods of applying tensile force to the donor film. As shown in FIG. 4A, tensile force may be applied to the donor film 200 by pressing opposite sides of the donor film 200. Alternatively, as shown in FIG. 4B, tensile force may be applied by rolling opposite sides of the donor film 200 using a roller.

After the transfer layer is transferred to the pixel openings, a common electrode (not shown) of the OLED display device 100 is formed on the transferred transfer layer 230.

As shown in FIG. 2, a pixel region of the OLED display device 100 may include, as a non-limiting example, a buffer layer 20 formed on the substrate 10, and a semiconductor layer 30 including a channel region 31 and source and drain regions 33 and 35 formed on a region of the buffer layer 20.

A gate insulating layer 40 is formed on the buffer layer 20 having the semiconductor layer 30, and a patterned gate electrode 50 is formed on the gate insulating layer 40.

An interlayer insulating layer 60 formed to expose one of source and drain regions 33 and 35 of the semiconductor layer 30 is formed on the gate insulating layer 40 having the gate electrode 50, and source and drain electrodes 71 and 73 are formed on one region of the interlayer insulating layer 60 to be in contact with the exposed one of the source and drain regions 33 and 35.

A planarization layer 80 formed to expose one of the source and drain electrodes 71 and 73 is formed on the interlayer insulating layer 60 having the source and drain electrodes 71 and 73, and a pixel electrode 90 electrically connected to the exposed one of the source and drain electrodes 71 and 73 is formed on the planarization layer 80.

A pixel defining layer 95 having an opening 98 partially exposing the pixel electrode 90 is formed on the planarization layer 80, and a transfer layer transferred from the donor film 200 is disposed on the opening 98, thereby forming a pixel (P). It is to be understood that the features of the OLED display device 100 may differ from what is described above.

As shown in FIG. 2, the donor film 200 disposed on the OLED display device 100 may include a base layer 210, a light-to-heat conversion layer 220, and a transfer layer 230. The transfer layer 230 includes at least an organic emitting layer, and may further include at least one selected from the group consisting of a hole injection layer, a hole transport layer, a hole blocking layer, an electron transport layer and an electron injection layer to improve characteristics of the device. The donor film 200 may further include an intermediate layer that improves a transfer characteristic or that protects the transfer layer.

The light-to-heat conversion layer 220 may be formed of a thin film using a metallic or metal compound by a dry method such as sputtering or evaporation.

Figure 3A:
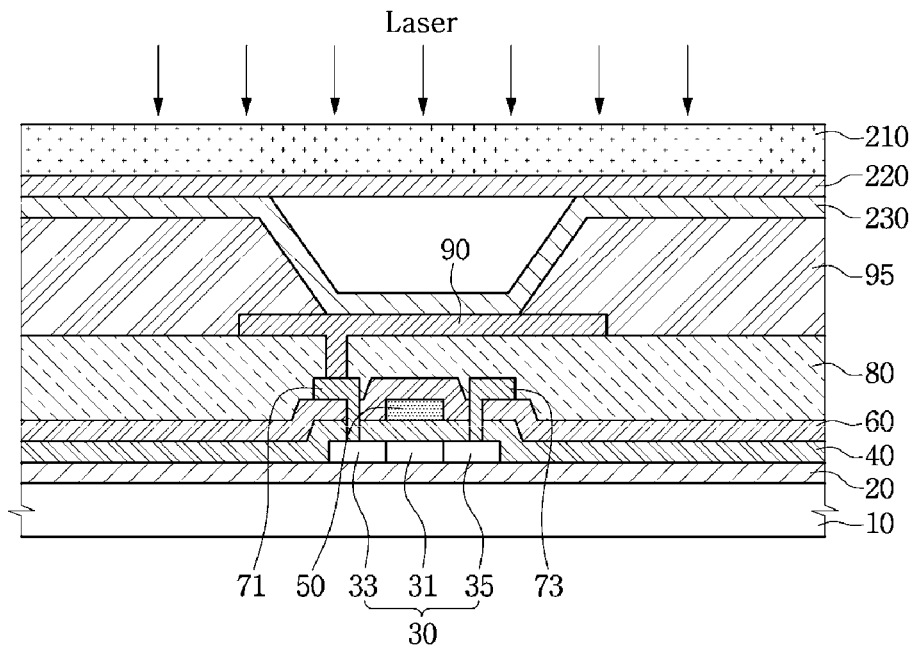
FIGS. 3A through 3C are cross-sectional views illustrating a method of fabricating an OLED display device according to an exemplary embodiment of the present invention.
Figure 3B:
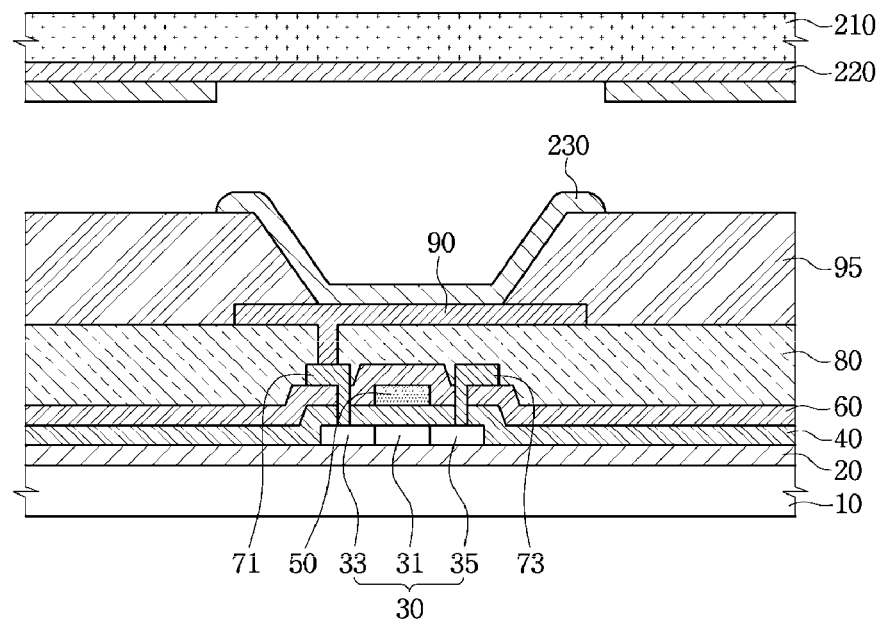
Figure 3C:
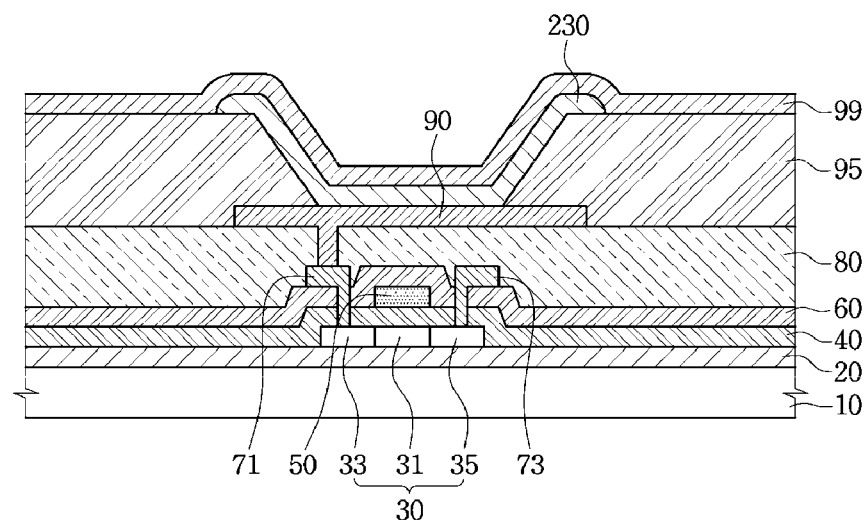

FIGS. 3A through 3C are cross-sectional views illustrating a method of fabricating an OLED display device according to an exemplary embodiment of the present invention.

As shown in FIG. 3A, a donor film 200 is disposed on an OLED display device 100 such that the donor film 200 and the OLED display device are adhered to each other.

To adhere the donor film 200 to the OLED display device 100, a tensile force is applied to the donor film 200 in a direction perpendicular to a short side of an opening 98 of a pixel P, that is, in the direction of the arrow (direction A) shown in FIG. 1.

If the tensile force applied to the donor film is applied in a direction perpendicular to a long side of the opening 98 of the pixel P, (that is, in direction B shown in FIG. 1), the long side of the opening 98 is under a lot of stress due to the tensile force. Thus, it is possible to have lifting of the transfer film 230 in a relatively large region of the opening 98 when the donor film 200 is separated from the OLED display device 100.

However, as described in the present embodiment, when the tensile force is applied in the direction A, the short side of the opening 98 receives the most stress due to the applied tensile force, and thus the region of the opening where there is a risk of lifting of the transfer film 230 when the donor film 200 is separated from the OLED display device 100 is relatively smaller.

In the related art, the region of the opening 98 where there is a risk of lifting of the transfer film 230 corresponds to the long side of the opening 98, but, according to the present embodiment, the region of the opening 98 where there is a risk of lifting corresponds to the short side, which is smaller.

As shown in FIG. 3A, while the donor film 200 is adhered to the OLED display device 100, laser energy is irradiated onto the donor film 200. A light-to-heat conversion layer 220 of the donor film 200 irradiated with laser energy converts the laser energy into heat, and thereby the transfer layer 230 is separated from the donor film 200 to be transferred into the opening 98 to cover the exposed pixel electrode 90 and pixel defining layer 95.

As shown in FIG. 3B, after the transfer layer 230 is transferred to the OLED display device 100, the donor film 200 and the OLED display device 100 are separated from each other.

To assist in the separation of the donor film 200 from the OLED display device 100, air may be injected between the donor film 200 and the OLED display device 100.

The transfer layer 230 is transferred to the separated OLED display device 100 through the openings 98. Only the portion of the transfer layer 230 of the donor film 200 that is irradiated with laser is transferred, while the rest of the transfer layer 230 remains in the donor film 200.

Afterwards, as shown in FIG. 3C, when the transfer layer 230 is transferred, a common electrode 99 is formed on a pixel defining layer 95 and the transfer layer 230.

According to aspects of the present invention, a method of fabricating an OLED display device minimizes a region of the OLED display device that is influenced by tensile force applied to a donor film, and a lifting phenomenon occurring when a donor film is separated from the OLED display device can be reduced, thereby increasing efficiency of transferring a transfer layer.

Although a few embodiments of the present invention have been shown and described, it would be appreciated by those skilled in the art that changes may be made in this embodi-

What is claimed is:

1. A method of fabricating an organic light emitting diode (OLED) display device, comprising:
   transferring a transfer layer of a donor film to aligned pixel openings in a pixel defining region of the OLED display device, wherein each pixel opening has a pair of long sides and a pair of short sides, such that an organic layer is formed in the pixel openings,
   wherein the transferring is performed while a tensile force is applied to the donor film in only a direction perpendicular to the short sides of the pixel openings.

2. The method according to claim 1, wherein the tensile force is applied before the donor film is adhered to the OLED display device.

3. The method according to claim 1, wherein the tensile force is applied while the donor film is in contact with the OLED display device.

4. The method according to claim 1, wherein the transfer layer includes an organic emitting layer, and at least one selected from the group consisting of a hole injection layer, a hole transport layer, a hole blocking layer, an electron transport layer, and an electron injection layer.

5. The method according to claim 1, wherein the transferring of the transfer layer occurs while the transfer layer is in contact with the OLED display device, and wherein the method further comprises, after the transferring of the transfer layer is completed, separating the donor film from the OLED display device.

6. The method according to claim 1, further comprising, after the transferring of the transfer layer is completed, forming a common electrode on an entire surface of the OLED display device including on the organic layer formed in each of the pixel openings.

7. The method according to claim 1, wherein the tensile force is applied to the donor film by pressing at least one side of the donor film.

8. The method according to claim 1, wherein the tensile force is applied to the donor film by rolling at least one side of the donor film on a roller.

9. A method of fabricating an organic light emitting diode (OLED) display device, comprising:
   transferring a transfer layer of a donor film to aligned pixel openings in a pixel defining region of the OLED display device,
   wherein each pixel opening has a pair of long sides and a pair of short sides, such that an organic layer is formed in the pixel openings,
   wherein the transferring is performed while a tensile force is applied to the donor film in a direction perpendicular to the short sides of the pixel openings,
   wherein the transferring of the transfer layer occurs while the transfer layer is in contact with the OLED display device,
   wherein the method further comprises, after the transferring of the transfer layer is completed, separating the donor film from the OLED display device, and
   wherein the separating of the donor film from the OLED display device is performed by injecting air between the donor film and the OLED display device.

* * * * *